(12) United States Patent
Kim et al.

(10) Patent No.: US 7,304,517 B2
(45) Date of Patent: Dec. 4, 2007

(54) DUTY CYCLE CORRECTOR

(75) Inventors: Joonho Kim, Cary, NC (US); Jung Pill Kim, Cary, NC (US); Jonghee Han, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/442,842

(22) Filed: May 30, 2006

(65) Prior Publication Data

US 2006/0214714 A1 Sep. 28, 2006

Related U.S. Application Data

(62) Division of application No. 11/032,459, filed on Jan. 10, 2005, now Pat. No. 7,230,465.

(51) Int. Cl.
*H03K 3/017* (2006.01)
(52) U.S. Cl. .................................. 327/175; 327/166
(58) Field of Classification Search ................ 327/175, 327/166
See application file for complete search history.

(56) References Cited

U.S. PATENT DOCUMENTS

| | | | | |
|---|---|---|---|---|
| 5,572,159 | A * | 11/1996 | McFarland | 327/276 |
| 6,496,042 | B1 * | 12/2002 | Nishikawa | 327/2 |
| 6,853,225 | B2 * | 2/2005 | Lee | 327/158 |
| 2003/0117194 | A1 * | 6/2003 | Lee | 327/158 |
| 2005/0110539 | A1 * | 5/2005 | Lee | 327/158 |

* cited by examiner

*Primary Examiner*—Kenneth B. Wells
*Assistant Examiner*—Ryan C. Jager
(74) *Attorney, Agent, or Firm*—Dicke, Billig & Czaja, PLLC (57) ABSTRACT

A duty cycle corrector, including a first, second circuit and a third circuit is disclosed. The third circuit is configured to obtain a threshold value in response to charge flow that is regulated by the first circuit and the second circuit, wherein the first circuit is configured to receive a clock signal and change the charge flow at a first transition of the clock signal. The second circuit is configured to change the charge flow at a second transition of the clock signal. The first circuit and the second circuit are configured to change the charge flow in response to obtaining the threshold value.

7 Claims, 6 Drawing Sheets

DUTY CYCLE CORRECTOR

CROSS-REFERENCE TO RELATED APPLICATIONS

This patent application is a Divisional of U.S. patent application Ser. No. 11/032,459, filed on Jan. 10, 2005 now U.S. Pat. No. 7,230,465, entitled "DUTY CYCLE CORRECTOR," and which is herein incorporated by reference.

BACKGROUND

Many digital circuits receive a clock signal to operate. One type of circuit that receives a clock signal to operate is a memory circuit, such as a dynamic random access memory (DRAM), synchronous dynamic random access memory (SDRAM), or double data rate synchronous dynamic random access memory (DDR-SDRAM). In a memory circuit operating at high frequencies, it is important to have a clock signal that has about a 50% duty cycle. This provides the memory circuit with approximately an equal amount of time on the high level phase and the low level phase of a clock cycle for transferring data, such as latching rising edge data and latching falling edge data into and out of the memory circuit.

Typically, a clock signal is provided by an oscillator, such as a crystal oscillator, and clock circuitry. The oscillator and clock circuitry often provide a clock signal that does not have a 50% duty cycle. For example, the clock signal may have a 45% duty cycle, where the high level phase is 45% of one clock cycle and the low level phase is the remaining 55% of the clock cycle. To correct or change the duty cycle of a clock signal, a duty cycle corrector provides signals with transitions separated by substantially one half of a clock cycle.

Typically, analog and digital duty cycle correctors receive many clock cycles to achieve duty cycle correction. In analog duty cycle correctors, it is difficult to keep accumulated charges for an extended length of time. Even in power saving mode, clock signals are provided to the analog duty cycle corrector to update the accumulated charges. Thus, even in power saving mode, the analog duty cycle corrector remains operable and clock buffers remain enabled, which continuously consumes power. In digital duty cycle correctors, fine delay units are difficult to make and complex control logic is needed to increase correction speed.

For these and other reasons there is a need for the present invention.

SUMMARY

One aspect of the present invention provides a duty cycle corrector comprising a first circuit and a second circuit. The first circuit is configured to receive a clock signal having a first phase and a second phase and to obtain a first threshold value based on the length of the first phase and part of the second phase and provide a first pulse and response to the first threshold value. The second circuit is configured to receive the clock signal and to obtain a second threshold value based on the length of the second phase and part of the first phase and provide a second pulse in response to the second threshold value. The time between the start of the first pulse and the start of the second pulse is substantially one half clock cycle.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
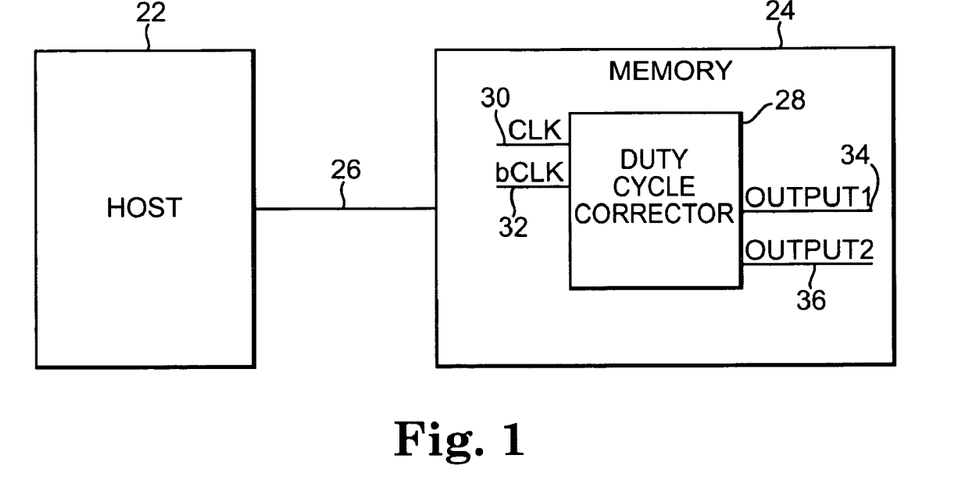
FIG. 1 is a block diagram illustrating one embodiment of an electronic system according to the present invention.

FIG. 1 is a block diagram illustrating one embodiment of an electronic system 20 according to the present invention. Electronic system 20 includes a host 22 and a memory circuit 24. Host 22 is electrically coupled to memory circuit 24 via memory communications path 26. Host 22 can be any suitable electronic host, such as a computer system including a microprocessor or a microcontroller. Memory circuit 24 can be any suitable memory, such as a memory that utilizes a clock signal to operate. In one embodiment, memory circuit 24 comprises a random access memory, such as a dynamic random access memory (DRAM), synchronous dynamic random access memory (SDRAM), or double data rate synchronous dynamic random access memory (DDR-SDRAM).

Memory circuit 24 includes a duty cycle corrector 28 that receives a clock signal CLK at 30 and an inverted clock signal bCLK at 32. Clock signal CLK at 30 is the inverse of inverted clock signal bCLK at 32. In one embodiment, duty cycle corrector 28 receives clock signal CLK at 30 and/or inverted clock signal bCLK at 32 via memory communications path 26. In other embodiments, duty cycle corrector 28 receives clock signal CLK at 30 and/or inverted clock signal bCLK at 32 from any suitable device, such as a dedicated clock circuit that is situated inside or outside memory circuit 24.

Duty cycle corrector 28 provides output signals OUTPUT1 at 34 and OUTPUT2 at 36. Each of the output signals, OUTPUT1 at 34 and OUTPUT2 at 36, includes a series of pulses. One pulse is provided in output signal OUTPUT1 at 34 and one pulse is provided in output signal OUTPUT2 at 36 during each clock cycle in clock signal CLK at 30 and inverted clock signal bCLK at 32. Each pulse in output signal OUTPUT1 at 34 starts substantially one clock cycle after the start of another pulse in output signal OUTPUT1 at 34. Also, each pulse in output signal OUTPUT1 at 34 starts substantially one half clock cycle after the start of a pulse in output signal OUTPUT2 at 36. Each pulse in output signal OUTPUT2 at 36 starts substantially one clock cycle after the start of another pulse in output signal OUTPUT2 at 36. Also, each pulse in output signal OUTPUT2 at 36 starts substantially one half clock cycle after the start of a pulse in output signal OUTPUT1 at 34. Duty cycle corrector 28 receives clock signal CLK at 30 and inverted clock signal bCLK at 32, which may not have 50% duty cycles, and provides pulses that are substantially one half clock cycle apart. Memory circuit 24 receives pulse edges that are substantially one half clock cycle apart in output signals OUTPUT1 at 34 and OUTPUT2 at 36 and transfers data in and out of memory circuit 24.

Figure 2:
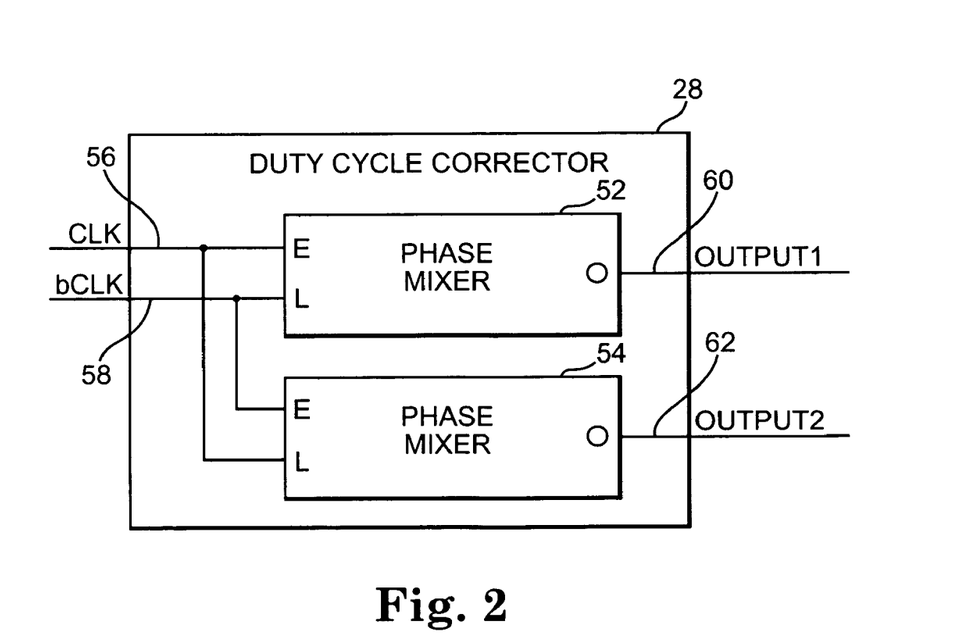
FIG. 2 is a block diagram illustrating one embodiment of a duty cycle corrector according to the present invention.

FIG. 2 is a block diagram illustrating one embodiment of a duty cycle corrector 28 according to the present invention. Duty cycle corrector 28 includes a first phase mixer 52 and a second phase mixer 54. Phase mixer 52 and phase mixer 54 each include an early input E, a late input L, and an output O.

The early input E of phase mixer 52 receives clock signal CLK at 56 and the late input L of phase mixer 52 receives inverted clock signal bCLK at 58. The early input E of phase mixer 54 receives inverted clock signal bCLK at 58 and the late input L of phase mixer 54 receives clock signal CLK at 56. Clock signal CLK at 56 is the inverse of inverted clock signal bCLK at 58. Output O of phase mixer 52 provides pulses in output signal OUTPUT1 at 60 and output O of phase mixer 54 provides pulses in output signal OUTPUT at 62.

One pulse is provided in output signal OUPUT1 at 60 and one pulse is provided in output signal OUTPUT2 at 62 during each clock cycle of clock signal CLK at 56 and inverted clock signal bCLK at 58. Each pulse in output signal OUTPUT1 at 60 starts one clock cycle after the start of another pulse in output signal OUTPUT1 at 60, and one half clock cycle after the start of a pulse in output signal OUTPUT2 at 62. Each pulse in output signal OUTPUT2 at 62 starts one clock cycle after the start of another pulse in output signal OUTPUT2 at 62, and one half clock cycle after the start of a pulse in output signal OUTPUT1 at 60.

Figure 3:
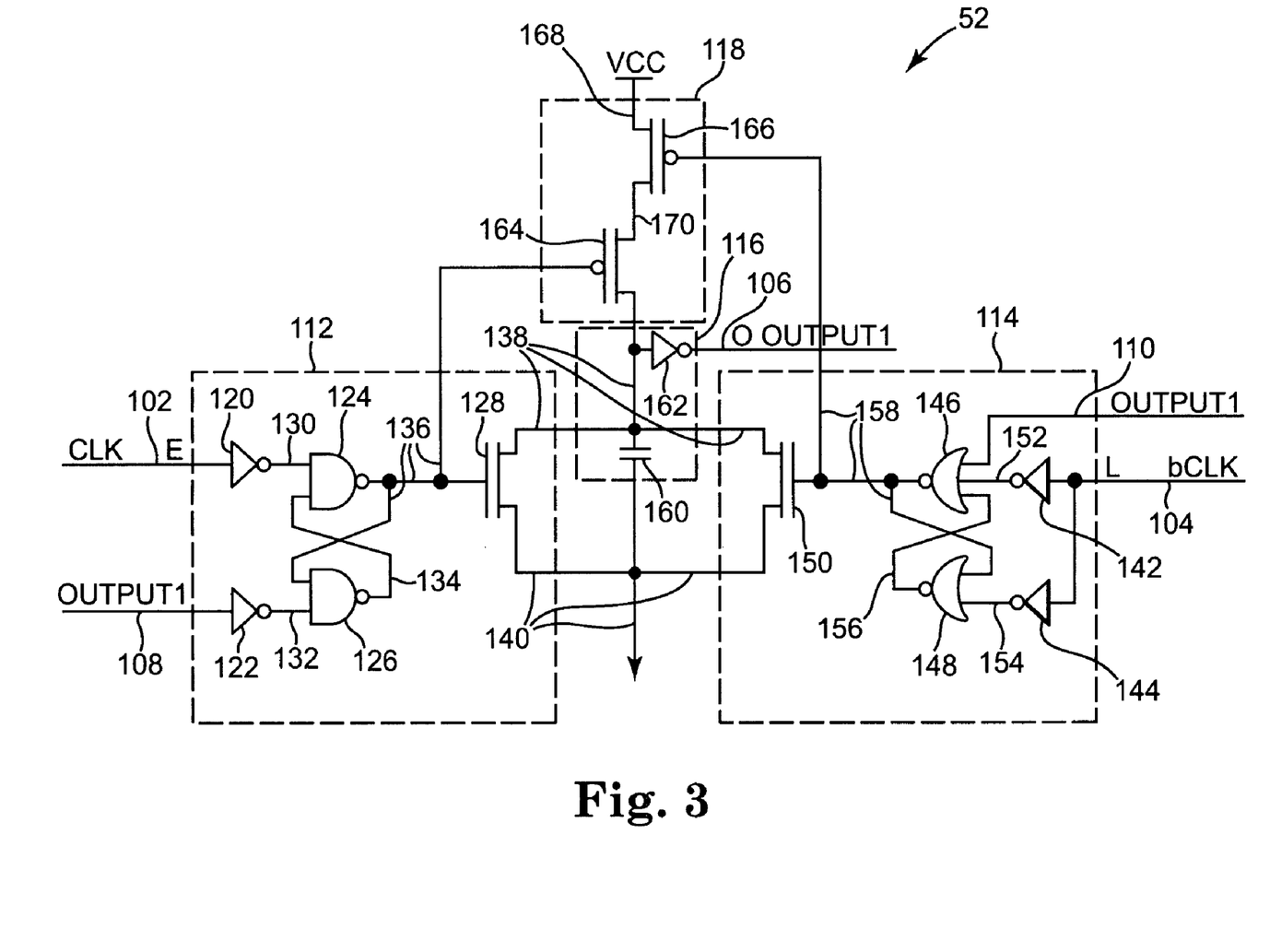
FIG. 3 is a diagram illustrating one embodiment of a phase mixer.

FIG. 3 is a diagram illustrating one embodiment of a phase mixer 52. Phase mixer 52 includes early input E that receives clock signal CLK at 102 and late input L that receives inverted clock signal bCLK at 104. Also, phase mixer 52 includes output O that provides output signal OUTPUT1 at 106, which is fed back into phase mixer 52 at 108 and 110. Phase mixer 54 (shown in FIG. 2) is similar to phase mixer 52 and includes early input E that receives inverted clock signal bCLK and late input L that receives clock signal CLK. Also, phase mixer 54 includes output O that provides output signal OUTPUT2, which is fed back into phase mixer 54 similar to the way output signal OUTPUT1 at 106 is fed back into phase mixer 52 at 108 and 110.

Phase mixer 52 includes an early signal control circuit 112, a late signal control circuit 114, an output circuit 116, and a charge circuit 118. Early signal control circuit 112 and late signal control circuit 114 control charge circuit 118 to charge output circuit 116. In addition, early signal control circuit 112 and late signal control circuit 114 control the discharge of output circuit 116.

Early signal control circuit 112 includes an early signal inverter 120, an output signal inverter 122, a first NAND gate 124, a second NAND gate 126, and an early signal n-channel metal oxide semiconductor (NMOS) transistor 128. The input of early signal inverter 120 receives clock signal CLK at 102 and the output of early signal inverter 120 is electrically coupled at 130 to one input of first NAND gate 124. The input of output signal inverter 122 receives output signal OUTPUT1 at 108 and the output of output signal inverter 122 is electrically coupled at 132 to one input of second NAND gate 126.

First NAND gate 124 and second NAND gate 126 are coupled in a latch configuration with the output of second NAND gate 126 electrically coupled at 134 to the other input of first NAND gate 124, and the output of first NAND gate 124 electrically coupled at 136 to the other input of second NAND gate 126. Also, the output of first NAND gate 124 is electrically coupled at 136 to the gate of early signal NMOS transistor 128 and to charge circuit 118. In addition, one side of the drain-source path of early signal NMOS transistor 128 is electrically coupled at 138 to output circuit 116, charge circuit 118, and late signal control circuit 114. The other side of the drain-source path of early signal NMOS transistor 128 is electrically coupled to a reference, such as ground, at 140.

Late signal control circuit 114 includes a first late signal inverter 142, a second late signal inverter 144, a first NOR gate 146, a second NOR gate 148, and a late signal NMOS transistor 150. The input of first late signal inverter 142 receives inverted clock signal bCLK at 104 and the output of first late signal inverter 142 is electrically coupled at 152 to one input of first NOR gate 146. Another input of first NOR gate 146 receives output signal OUTPUT1 at 110. The input of second late signal inverter 144 receives inverted clock signal bCLK at 104 and the output of second late signal inverter 144 is electrically coupled at 154 to one input of second NOR gate 148.

First NOR gate 146 and second NOR gate 148 are coupled in a latch configuration with the output of second NOR gate 148 electrically coupled at 156 to the third input of first NOR gate 146, and the output of first NOR gate 146 electrically coupled at 158 to the other input of second NOR gate 148. Also, the output of first NOR gate 146 is electrically coupled at 158 to the gate of late signal NMOS transistor 150 and to charge circuit 118. In addition, one side of the drain-source path of late signal NMOS transistor 150 is electrically coupled at 138 to output circuit 116, charge circuit 118, and the one side of the drain-source path of early signal NMOS transistor 128. The other side of the drain-source path of late signal NMOS transistor 150 is electrically coupled to the reference, such as ground, at 140.

Output circuit 116 includes a capacitor 160 and an output inverter 162. One side of capacitor 160 is electrically coupled at 138 to the input of output inverter 162 and to charge circuit 118. Also, this one side of capacitor 160 is electrically coupled at 138 to the drain-source path of early signal NMOS transistor 128 and to the drain-source path of late signal NMOS transistor 150. The other side of capacitor 160 is electrically coupled to the reference at 140. The output of output inverter 162 provides the output signal OUTPUT1 at 106.

Charge circuit 118 includes a first p-channel metal oxide semiconductor (PMOS) transistor 164 and a second PMOS transistor 166. One side of the drain-source path of second PMOS transistor 166 is electrically coupled to power VCC at 168. The other side of the drain-source path of second PMOS transistor 166 is electrically coupled at 170 to one side of the drain-source path of first PMOS transistor 164. The other side of the drain-source path of first PMOS transistor 164 is electrically coupled at 138 to one side of capacitor 160 and the input of output inverter 162. Also, this side of the drain-source path of first PMOS transistor 164 is electrically coupled at 138 to the drain-source path of early signal NMOS transistor 128 and to the drain-source path of late signal NMOS transistor 150. The gate of first PMOS transistor 164 is electrically coupled at 136 to the output of first NAND gate 136, and the gate of second PMOS transistor 166 is electrically coupled at 158 to the output of first NOR gate 146.

In operation, output inverter 162 provides a high logic level output signal OUTPUT1 at 106 if capacitor 160 is discharged to a voltage value that is below the threshold voltage of output inverter 162. Output signal inverter 122 receives the high logic level output signal OUTPUT1 at 108 and provides a low logic level to second NAND gate 126 that provides a high logic level to first NAND gate 124. If clock signal CLK at 102 is at a low logic level, early signal inverter 120 provides a high logic level to first NAND gate 124 and with both inputs at high logic levels, first NAND gate 124 provides a low logic level output that turns off early signal NMOS transistor 128 and turns on first PMOS transistor 164.

With clock signal CLK at 102 at a low logic level, inverted clock signal bCLK at 104 is at a high logic level. First late signal inverter 142 provides a low logic level to first NOR gate 146 and second late signal inverter 144 provides a low logic level to second NOR gate 148. With the output signal OUTPUT1 at a high logic level, first NOR gate 146 provides a low logic level to the other input of second NOR gate 148 and with both inputs at logic low levels, second NOR gate 148 provides a high logic level to first NOR gate 146. Also, the low logic level output of first NOR gate 146 turns off late signal NMOS transistor 150 and turns on second PMOS transistor 166.

Since first and second PMOS transistors 164 and 166 are turned on and early and late signal NMOS transistors 128 and 150 are turned off, capacitor 160 charges to a high voltage level. As the voltage value on capacitor 160 rises above the threshold voltage of output inverter 162, output inverter 162 transitions to provide a low logic level output signal OUTPUT1 at 106.

Output signal inverter 122 receives the low logic level output signal OUTPUT1 at 108 and provides a high logic level to second NAND gate 126. Since the other input of second NAND gate 126 is at a low logic level, the output of second NAND gate 126 remains at a high logic level and the output of first NAND gate 124 remains at a low logic level. Also, first NOR gate 146 receives the low logic level output signal OUTPUT1 at 110. Since the output of second NOR gate 148 is at a high logic level, the output of first NOR gate remains at a low logic level. Thus, first and second PMOS transistors 164 and 166 remain turned on and early and late signal NMOS transistors 128 and 150 remain turned off.

Next, clock signal CLK at 102 transitions to a high logic level and inverted clock signal bCLK at 104 transitions to a low logic level. The output of early signal inverter 120 transitions from a high logic level to a low logic level and first NAND gate 124 transitions to provide a high logic level that turns on early signal NMOS transistor 128 and turns off first PMOS transistor 164. This terminates charging of capacitor 160 and begins discharging capacitor 160 via early signal NMOS transistor 128. The high logic level from first NAND gate 124 and the high logic level from output signal inverter 122 are received by second NAND gate 126 that provides a low logic level that latches in the high logic level output of first NAND gate 124.

The output of first late signal inverter 142 transitions to a high logic level and the output of first NOR gate 146 remains at a low logic level. Also, the output of second late signal inverter 144 transitions to a high logic level and the output of second NOR gate 148 transitions to a low logic level that is provided to first NOR gate 146. The output of first NOR gate 146 remains at the low logic level.

Next, clock signal CLK at 102 transitions to a low logic level and inverted clock signal bCLK at 104 transitions to a high logic level. At this time, capacitor 160 is discharging via early signal NMOS transistor 128 and the voltage value on capacitor 160 remains above the threshold value of output inverter 162. The output signal OUTPUT1 at 108 remains at a low logic level and the output of output signal inverter 122 remains at a high logic level. The output of first NAND gate 124 is at a high logic level and with both inputs at high logic levels, second NAND gate 126 continues to provide a low logic level to first NAND gate 124. The output of early signal inverter 120 transitions from a low logic level to a high logic level, but first NAND gate 124 remains at the high logic level latched in by the low logic level provided by second NAND gate 126.

The output of first late signal inverter 142 transitions to a low logic level, while the output signal OUTPUT1 at 110 remains at a low logic level and the output of second NOR gate 148 remains at a low logic level. With all three inputs at low logic levels, the output of first NOR gate 146 transitions to a high logic level that is provided to second NOR gate 148. In this embodiment, the output of first late signal inverter 142 is configured to transition to a low logic level and the output of first NOR gate 146 is configured to transition to a high logic level before the output of second late signal inverter 144 transitions to a low logic level. The output of second late signal inverter 144 transitions to a low logic level and the output of second NOR gate 148 remains at a low logic level due to the high logic level provided by first NOR gate 146. The high logic level provided by first NOR gate 146 turns on late signal NMOS transistor 150 and turns off first PMOS transistor 166. Capacitor 160 is discharged via early signal NMOS transistor 128 and late signal NMOS transistor 150, which discharges capacitor 160 at twice the discharge rate provided by discharging capacitor 160 via only early signal NMOS transistor 128.

The voltage value on capacitor 160 decreases below the threshold voltage of output inverter 162 and output signal OUTPUT1 at 106 transitions to a high logic level. Output signal inverter 122 receives output signal OUTPUT1 at 108 and provides a low logic level to second NAND gate 126 that transitions to provide a high logic level to one of the inputs of first NAND gate 124. Clock signal CLK at 102 is at a low logic level and early signal inverter 120 provides a high logic level to the other input of first NAND gate 124. With both inputs at high logic levels, first NAND gate 124 transitions to provide a low logic level that turns off early signal NMOS transistor 128 and turns on first PMOS transistor 164. Turning off early signal NMOS transistor 128 terminates discharging of capacitor 160 via early signal NMOS transistor 128. The low logic level of first NAND gate 124 is provided to second NAND gate 126 to latch in the high logic level of second NAND gate 126.

First NOR gate 146 receives the high logic level output signal OUTPUT1 at 110 and provides a low logic level that turns off late signal NMOS transistor 150 and turns on second PMOS transistor 166. Turning off late signal NMOS transistor 150 terminates discharging of capacitor 160 via late signal NMOS transistor 150. Since first and second PMOS transistors 164 and 166 are turned on and early and late signal NMOS transistors 128 and 150 are turned off, capacitor 160 charges to a high voltage level.

The low logic level of first NOR gate 146 is provided to one input of second NOR gate 148. Inverted clock signal bCLK at 104 is at a high logic level and second late signal inverter 144 provides a low logic level, to the other input of second NOR gate 148. With both inputs at low logic levels, second NOR gate 148 provides a high logic level to first NOR gate 146 to latch in the low logic level output of first NOR gate 146.

As the voltage value on capacitor 160 rises above the threshold voltage of output inverter 162, the output of output inverter 162 transitions to provide a low logic level output signal OUTPUT1 at 106. Output signal inverter 122 receives the low logic level output signal OUTPUT1 at 108 and provides a high logic level to second NAND gate 126. With the other input of second NAND gate 126 at a low logic level, the output of second NAND gate 126 remains at a high logic level. First NOR gate 146 receives the low logic level output signal OUTPUT1 at 110. With second NOR gate 148 providing a high logic level, the output of first NOR gate 146 remains at a low logic level. Thus, output inverter 162 transitions from a low logic level to a high logic level and back to a low logic level to provide a pulse for each cycle of clock signal CLK at 102 and inverted clock signal bCLK at 104.

In another clock cycle, at the rising edge of clock signal CLK at 102, early signal control circuit 112 begins to discharge capacitor 160 and at the rising edge of inverted clock signal bCLK at 104, late signal control circuit 114 also discharges capacitor 160. The voltage value on capacitor 160 is discharged below the threshold voltage of output inverter 162 and output inverter 162 transitions to a high logic level that begins the charging of capacitor 160. As the voltage value on capacitor 160 rises above the threshold voltage of output inverter 162, the output of output inverter 162 transitions to provide a low logic level output signal OUTPUT1 at 106 and phase mixer 52 is ready for the next clock cycle.

Phase mixer 54 (shown in FIG. 2) is similar to phase mixer 52. However, phase mixer 54 includes an early input E that receives inverted clock signal bCLK and a late input L that receives clock signal CLK. The pulse provided by phase mixer 54 is one half clock cycle away from the pulse provided by phase mixer 52.

Figure 4:
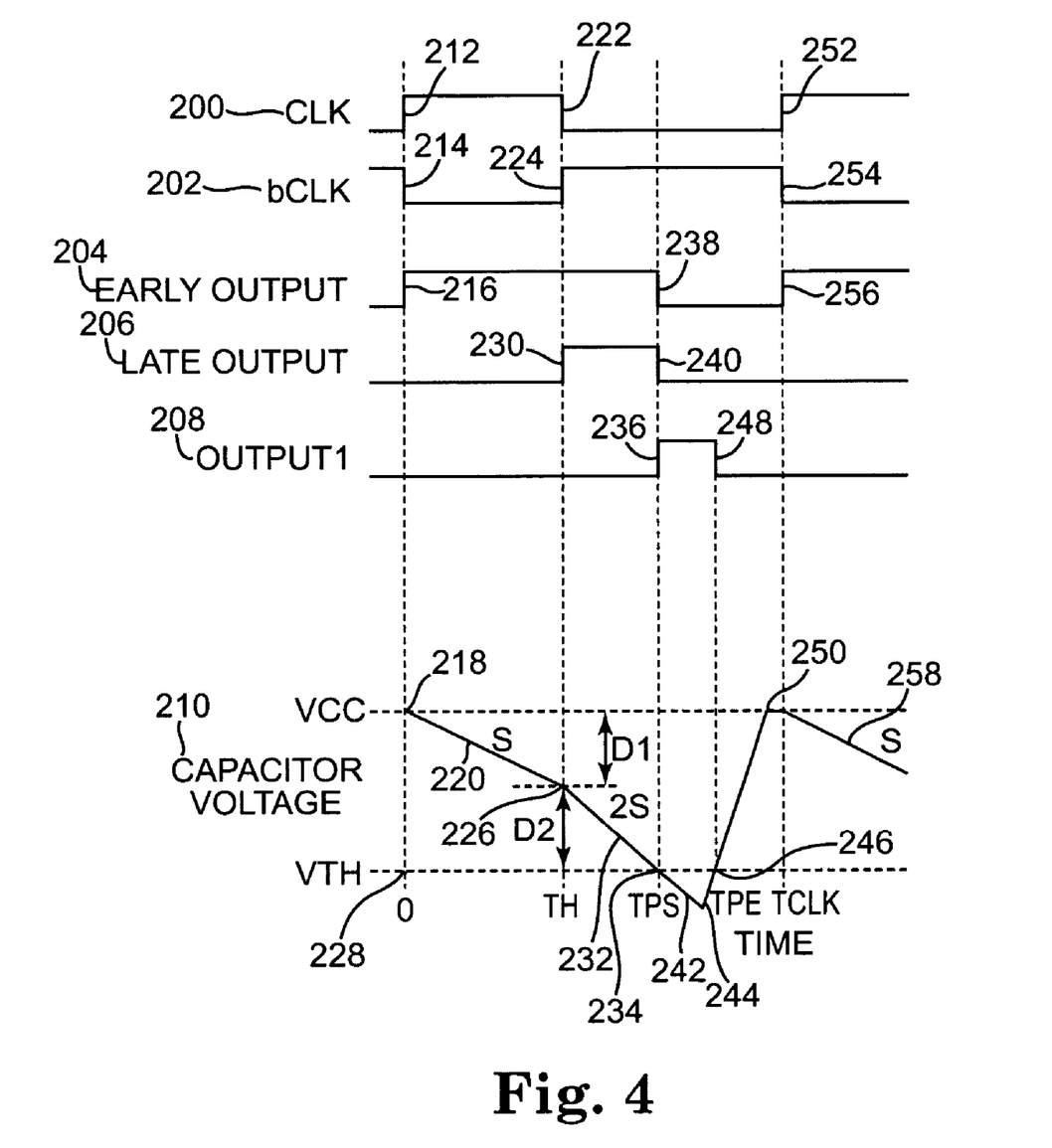
FIG. 4 is a timing diagram illustrating the operation of one embodiment of a phase mixer.

FIG. 4 is a timing diagram illustrating the operation of phase mixer 52 of FIG. 3. Clock signal CLK at 200 is provided to the early input E of phase mixer 52 and inverted clock signal bCLK at 202 is provided to the late input L of phase mixer 52. The output of first NAND gate 124 is EARLY OUTPUT at 204 and the output of first NOR gate 146 is LATE OUTPUT at 206. The output of output inverter 162 is output signal OUTPUT1 at 208 and the voltage on capacitor 160 is the CAPACITOR VOLTAGE signal at 210.

At time 0, clock signal CLK at 200 transitions to a high logic level at 212 and inverted clock signal bCLK at 202 transitions to a low logic level at 214. Early signal inverter 120 transitions to a low logic level and EARLY OUTPUT at 204, which is the output of first NAND gate 124, transitions to a high logic level at 216. The high logic level at 216 turns on early signal NMOS transistor 128 and turns off first PMOS transistor 164, which terminates charging of capacitor 160 and begins discharging of capacitor 160 via early signal NMOS transistor 128. The CAPACITOR VOLTAGE at 210 that was charged to a voltage value of about VCC at 218, discharges at a discharge rate of S at 220.

The output of first late signal inverter 142 transitions to a high logic level and the output of first NOR gate 146 remains at a low logic level. Also, the output of second late signal inverter 144 transitions to a high logic level and the output of second NOR gate 148 transitions to a low logic level that is provided to first NOR gate 146. The output of first NOR gate 146 remains at the low logic level.

At time TH, clock signal CLK at 200 transitions to a low logic level at 222 and inverted clock signal bCLK at 202 transitions to a high logic level at 224. At 226, the CAPACITOR VOLTAGE at 210 remains above the threshold value VTH at 228 of output inverter 162 and output signal OUTPUT1 at 208 remains at a low logic level.

The output of output signal inverter 122 remains at a high logic level and EARLY OUTPUT at 204 remains at a high logic level. With both inputs at high logic levels, second NAND gate 126 provides a low logic level to first NAND gate 124. The output of early signal inverter 120 transitions from a low logic level to a high logic level, but EARLY OUTPUT at 204 remains at the high logic level due to the low logic level provided by second NAND gate 126.

The output of first late signal inverter 142 transitions to a low logic level, while the output signal OUTPUT1 at 208 remains at a low logic level and the output of second NOR gate 148 remains at a low logic level. With all three inputs at low logic levels, LATE OUTPUT at 206, which is the output of first NOR gate 146, transitions to a high logic level at 230. The high logic level at 230 turns on late signal NMOS transistor 150 and turns off first PMOS transistor 166. Capacitor 160 is discharged via early signal NMOS transistor 128 and late signal NMOS transistor 150 and the CAPACITOR VOLTAGE at 210 discharges at twice the discharge rate or 2 S at 232.

At time TPS, the CAPACITOR VOLTAGE at 210 crosses at 234 the threshold voltage VTH at 228 and output signal OUTPUT1 at 208 transitions to a high logic level at 236. Output signal inverter 122 receives output signal OUTPUT1 at 208 and provides a low logic level to second NAND gate 126 that transitions to provide a high logic level to one of the inputs of first NAND gate 124. Clock signal CLK at 200 is at a low logic level and early signal inverter 120 provides a high logic level to the other input of first NAND gate 124. With both inputs at high logic levels, EARLY OUTPUT at 204 transitions to a low logic level at 238 that turns off early signal NMOS transistor 128 and turns on first PMOS transistor 164.

First NOR gate 146 receives the high logic level output signal OUTPUT1 at 208 and LATE OUTPUT 206 provides a low logic level at 240 that turns off late signal NMOS transistor 150 and turns on second PMOS transistor 166. As first and second PMOS transistors 164 and 166 are turned on and early signal and late signal NMOS transistors 128 and 150 are turned off, CAPACITOR VOLTAGE at 210 continues to discharge at 242 and begins to charge to a high voltage level at 244.

The low logic level of LATE OUTPUT at 206 is provided to one input of second NOR gate 148. Inverted clock signal bCLK at 202 is at a high logic level and second late signal inverter 144 provides a low logic level to the other input of second NOR gate 148. With both inputs at low logic levels, second NOR gate 148 provides a high logic level to first NOR gate 146 to latch in the low logic level LATE OUTPUT at 206.

At time TPE, the CAPACITOR VOLTAGE at 210 crosses at 246 the threshold voltage VTH at 228 and output signal OUTPUT1 at 208 transitions to a low logic level at 248. Output signal inverter 122 receives the low logic level output signal OUTPUT1 at 208 and provides a high logic level to second NAND gate 126. With EARLY OUTPUT at 204 that is the other input of second NAND gate 126 at a low logic level, the output of second NAND gate 126 remains at a high logic level. Also, first NOR gate 146 receives the low logic level output signal OUTPUT1 at 208 and with second NOR gate 148 providing a high logic level, LATE OUTPUT at 206, which is the output of first NOR gate 146, remains at a low logic level. Thus, output signal OUTPUT1 at 208 provides a pulse that starts at time TPS and ends at time TPE. Output signal OUTPUT1 at 208 transitions from a low logic level to a high logic level at 230 and back to a low logic level at 240 to provide a pulse for each clock cycle of clock signal CLK at 200 and inverted clock signal bCLK at 202. The CAPACITOR VOLTAGE at 210 charges to a high voltage at 250 of VCC.

In another clock cycle, at time TCLK, clock signal CLK at 200 transitions to a high logic level at 252 and inverted clock signal bCLK at 202 transitions to a low logic level at 254. Early signal inverter 120 transitions to a low logic level and EARLY OUTPUT at 204, which is the output of first NAND gate 124, transitions to a high logic level at 256. The high logic level at 256 turns on early signal NMOS transistor 128 and turns off first PMOS transistor 164, which terminates charging of capacitor 160 and begins discharging of capacitor 160 via early signal NMOS transistor 128. The CAPACITOR VOLTAGE at 210 discharges at a discharge rate of S at 258 and the sequence of events continues as previously described to provide a pulse in output signal OUTPUT1 at 208 that begins at a time TPS and ends at a time TPE after the start of the current clock cycle.

The time TPS from the start of the current clock cycle to the start of the pulse is the same for each clock cycle in clock signal CLK at 200. During the time between time 0 and time TH, the CAPACITOR VOLTAGE at 210 discharges a voltage value D1 as described in Equation I.

$$D1 = S*TH \qquad \text{Equation I}$$

where, S is the discharge rate and TH is the discharge time.

During the time between time TH and time TPS, the CAPACITOR VOLTAGE at 210 discharges a voltage value D2 as described in Equation II.

$$D2 = (2*S)*(TPS-TH) \qquad \text{Equation II}$$

where, (2*S) is the discharge rate and (TPS–TH) is the discharge time.

The voltage discharged between time 0 and time TPS is described in Equation III.

$$VCC-VTH = D1 + D2 \qquad \text{Equation III}$$

where, capacitor 160 is charged to the high voltage level of VCC and discharged to the threshold voltage VTH of output inverter 162 at time TPS.

Substituting for voltage values D1 and D2 in Equation III and reducing results in Equation IV.

$$VCC-VTH = (2*S*TPS) - (S*TH) \qquad \text{Equation IV}$$

Solving for TPS in Equation IV, results in Equation V.

$$TPS = (((VCC-VTH)/S) + TH)/2 \qquad \text{Equation V}$$

The time TPS is a function of the high voltage level VCC, threshold voltage VTH, discharge rate S and the length TH of the high level phase of clock signal CLK at 200. Each of these values is a constant for phase mixer 52 and clock signal CLK at 200 that has a steady duty cycle. As a result, one pulse in output signal OUTPUT1 at 208 occurs one clock cycle away from the next pulse in output signal OUTPUT1 at 208.

Figure 5:
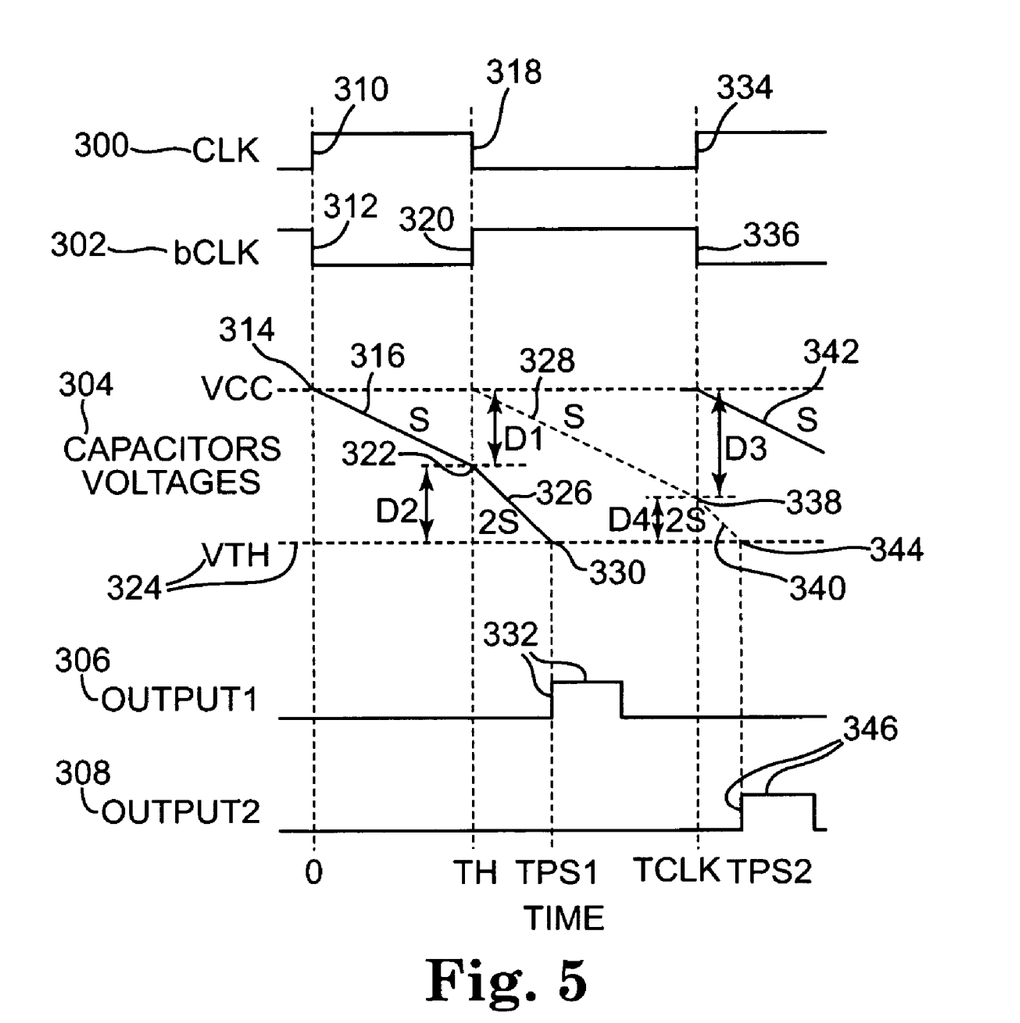
FIG. 5 is a timing diagram illustrating the operation of one embodiment of a duty cycle corrector.

FIG. 5 is a timing diagram illustrating the operation of duty cycle corrector 28 of FIG. 2. Duty cycle corrector 28 includes phase mixer 52 of FIG. 3 and phase mixer 54 that is similar to phase mixer 52. Phase mixer 52 includes an early input E that receives clock signal CLK at 300 and a late input L that receives inverted clock signal bCLK at 302. Phase mixer 54 includes an early input E that receives inverted clock signal bCLK at 302 and a late input L that receives clock signal CLK at 300.

Each of the phase mixers 52 and 54 includes a capacitor that is charged and discharged to provide the capacitor voltage signals CAPACITORS VOLTAGES at 304. Phase mixer 52 provides output signal OUTPUT1 at 306 and phase mixer 54 provides output signal OUTPUT2 at 308. Each of the output signals, OUTPUT1 at 306 and OUTPUT2 at 308, includes one pulse per clock cycle of clock signal CLK at 300 and inverted clock signal bCLK at 302. Each pulse provided by phase mixer 54 is one half clock cycle from a pulse provided by phase mixer 52 and each pulse provided by phase mixer 52 is one half clock cycle from a pulse provided by phase mixer 54.

At time 0, clock signal CLK at 300 transitions to a high logic level at 310 and inverted clock signal bCLK at 302 transitions to a low logic level at 312. In phase mixer 52, early signal inverter 120 transitions to a low logic level and the output of first NAND gate 124 transitions to a high logic level that turns on early signal NMOS transistor 128 and turns off first PMOS transistor 164. This terminates charging of capacitor 160 and begins discharging of capacitor 160 via early signal NMOS transistor 128. The voltage on capacitor 160 in phase mixer 52, which was charged to a voltage value of about VCC at 314, discharges at a discharge rate of S at 316.

At time TH, clock signal CLK at 300 transitions to a low logic level at 318 and inverted clock signal bCLK at 302 transitions to a high logic level at 320. At 322, the voltage on capacitor 160 in phase mixer 52 remains above the threshold value VTH at 324 of output inverter 162 in phase mixer 52 and output signal OUTPUT1 at 306 remains at a low logic level. The output of first late signal inverter 142 in phase mixer 52 transitions to a low logic level, while the output signal OUTPUT1 at 306 remains at a low logic level and the output of second NOR gate 148 remains at a low logic level. With all three inputs at low logic levels, the output of first NOR gate 146 transitions to a high logic level that turns on late signal NMOS transistor 150 and turns off first PMOS transistor 166. Capacitor 160 is discharged via early signal NMOS transistor 128 and late signal NMOS transistor 150 at twice the discharge rate or 2 S at 326.

In phase mixer 54 at time TH, the early signal inverter transitions to a low logic level and the output of the first NAND gate transitions to a high logic level that turns on the early signal NMOS transistor and turns off the first PMOS transistor. This terminates charging of the capacitor in phase mixer 54 and begins discharging the capacitor via the early signal NMOS transistor. The voltage on the capacitor in phase mixer 54, which was charged to a voltage value of about VCC at 314, discharges at a discharge rate of S at 328.

At time TPS1, the voltage on capacitor 160 in phase mixer 52 crosses at 330 the threshold voltage VTH at 324 and output signal OUTPUT1 at 306 transitions to a high logic level to provide a pulse at 332.

At time TCLK, clock signal CLK at 300 transitions to a high logic level at 334 and inverted clock signal bCLK at 302 transitions to a low logic level at 336. At 338, the voltage on the capacitor in phase mixer 54 remains above the threshold value VTH at 324 of the output inverter in phase mixer 54 and output signal OUTPUT2 at 308 remains at a low logic level. The output of the first late signal inverter transitions to a low logic level, while the output signal OUTPUT2 at 308 remains at a low logic level and the output of the second NOR gate remains at a low logic level. With all three inputs at low logic levels, the output of the first NOR gate transitions to a high logic level that turns on the late signal NMOS transistor and turns off the first PMOS transistor. The capacitor in phase mixer 54 is discharged via the early signal NMOS transistor and the late signal NMOS transistor at twice the discharge rate or 2 S at 340.

In phase mixer 52 at time TCLK, early signal inverter 120 transitions to a low logic level and the output of first NAND gate 124 transitions to a high logic level that turns on early signal NMOS transistor 128 and turns off first PMOS transistor 164. This terminates charging of capacitor 160 and begins discharging of capacitor 160 via early signal NMOS transistor 128. The voltage on capacitor 160 in phase mixer 52, which was charged to a voltage value of about VCC at 314, discharges at a discharge rate of S at 342.

At time TPS2, the voltage on the capacitor in phase mixer 54 crosses at 344 the threshold voltage VTH at 324 and output signal OUTPUT2 at 308 transitions to a high logic level to provide a pulse at 346. The voltage on capacitor 160 in phase mixer 52 continues to discharge at the discharge rate of S at 342 and the sequence repeats itself.

The rising edge of the pulse at 346 is at time TPS2 and the rising edge of the pulse at 332 is at time TPS1. The time between the rising edge of the pulse at 346 and the rising edge of the pulse at 332 is one half clock cycle. The time TPS1 is the same as time TPS in Equation V, where D1 and D2 in FIG. 4 are the same as D1 and D2 in FIG. 5. During the time between time TH and time TCLK, the capacitor in phase mixer 54 discharges the voltage value D3 in Equation VI.

$$D3 = S*(TCLK - TH) \qquad \text{Equation VI}$$

where, S is the discharge rate that is the same as the discharge rate S in Equation I and (TCLK−TH) is the discharge time.

During the time between time TCLK and time TPS2, the capacitor in phase mixer 54 discharges the voltage value D4 in Equation VII.

$$D4 = (2*S)*(TPS2 - TCLK) \qquad \text{Equation VII}$$

where, (2*S) is the discharge rate and (TPS2−TCLK) is the discharge time.

The voltage discharged between time TH and time TPS2 is in Equation VIII.

$$VCC - VTH = D3 + D4 \qquad \text{Equation VIII}$$

where, the capacitor in phase mixer 54 is charged to the high voltage level of VCC and discharged to the threshold voltage VTH of the output inverter in phase mixer 54 at time TPS2. The threshold voltage VTH of the output inverter in phase mixer 54 is the same as the threshold voltage VTH of output inverter 162 in phase mixer 52.

Substituting for voltage values D3 and D4 in Equation VIII and reducing results in Equation IX.

$$VCC - VTH = (2*S*TPS2) - (S \times TH) - (S*TCLK) \qquad \text{Equation IX}$$

Solving for TPS2 in Equation IX, results in Equation X.

$$TPS2 = (((VCC - VTH)/S) + TH + TCLK)/2 \qquad \text{Equation X}$$

Subtracting TPS1, which is TPS in Equation V, from TPS2 in Equation X, results in Equation XI.

$$(((VCC-VTH)/S)+TH+TCLK)/2 - (((VCC-VTH)/S)+ \\ TH)/2 = TCLK/2 \qquad \text{Equation XI}$$

where, TCLK is the length of a clock cycle and TCLK/2 is one half of a clock cycle.

Thus, the time between the rising edge of the pulse at 346 and the rising edge of the pulse at 332 is one half clock cycle. Also, the time between any adjacent pulses in output signals OUTPUT1 and OUTPUT2 is one half clock cycle. Duty cycle corrector 28 corrects the duty cycle of incoming clock signals by providing rising edges that are one half clock cycle apart for a duty cycle of 50%.

Figure 6:
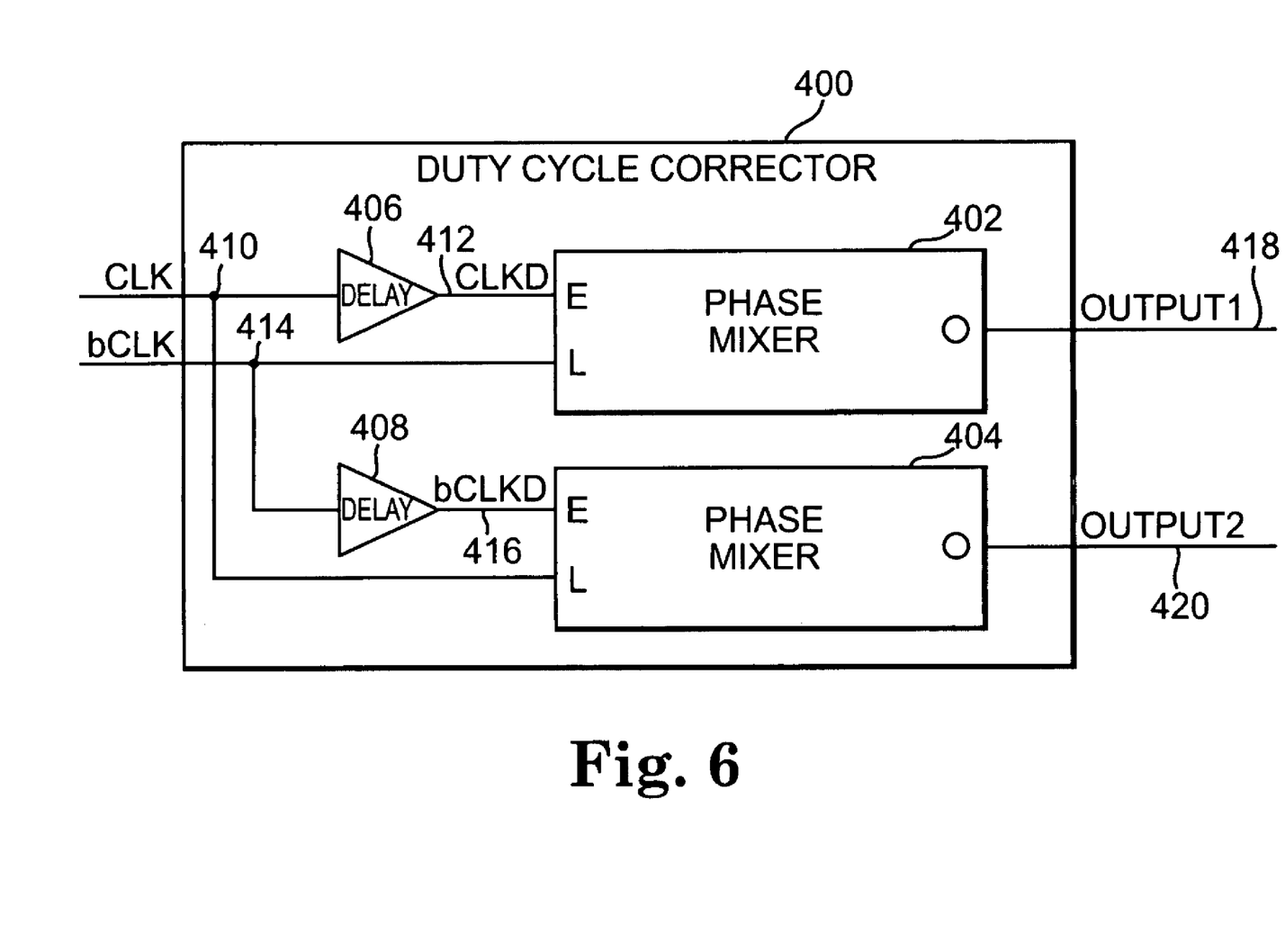
FIG. 6 is a diagram illustrating another embodiment of a duty cycle corrector according to the present invention.

FIG. 6 is a diagram illustrating one embodiment of a duty cycle corrector 400 according to the present invention. Duty cycle corrector 400 is similar to duty cycle corrector 28 of FIG. 2. Duty cycle corrector 400 includes a first phase mixer 402, a second phase mixer 404, a first delay circuit 406, and a second delay circuit 408. First phase mixer 402 is similar to first phase mixer 52 (shown in FIGS. 2 and 3) and second phase mixer 404 is similar to second phase mixer 54 (shown in FIG. 2). Phase mixer 402 and phase mixer 404 each include an early input E, a late input L, and an output O.

The input of delay circuit 406 receives clock signal CLK at 410 and provides delayed clock signal CLD at 412. The input of delay circuit 408 receives inverted clock signal bCLK at 414 and provides delayed inverted clock signal bCLKD at 416. Clock signal CLK at 410 is the inverse of inverted clock signal bCLK at 414.

The early input E of phase mixer 402 receives delayed clock signal CLKD at 412 and the late input L of phase mixer 402 receives inverted clock signal bCLK at 414. The early input E of phase mixer 404 receives delayed inverted clock signal bCLKD at 416 and the late input L of phase mixer 404 receives clock signal CLK at 410. Output O of phase mixer 402 provides pulses in output signal OUTPUT1 at 418 and output O of phase mixer 404 provides pulses in output signal OUTPUT2 at 420.

One pulse is provided in output signal OUPUT1 at 418 and one pulse is provided in output signal OUTPUT2 at 420 during each clock cycle of clock signal CLK at 410 and inverted clock signal bCLK at 414. Each pulse in output signal OUTPUT1 at 418 starts substantially one clock cycle after the start of another pulse in output signal OUTPUT1 at 418, and substantially one half clock cycle after the start of a pulse in output signal OUTPUT2 at 420. Each pulse in output signal OUTPUT2 at 420 starts substantially one clock cycle after the start of another pulse in output signal OUTPUT2 at 420, and substantially one half clock cycle after the start of a pulse in output signal OUTPUT1 at 418.

Phase mixer 402 receives delayed clock signal CLKD at 412 and inverted clock signal bCLK at 414. In operation, the rising edge of delayed clock signal CLKD at 412 occurs prior to the rising edge of inverted clock signal bCLK at 414 to begin discharging the capacitor in phase mixer 402. The rising edge of delayed clock signal CLKD at 412 occurs closer to the rising edge of inverted clock signal bCLK at 414, than does the rising edge of clock signal CLK at 410 that was delayed to provide the rising edge of delayed clock signal CLKD at 412. By receiving delayed clock signal CLKD at 412, instead of clock signal CLK at 410, at the early input E, phase mixer 402 provides a pulse after a shorter mixing time than duty cycle corrector 28. Also, receiving delayed clock signal CLKD at 412, instead of clock signal CLK at 410, at the early input E provides more time for precharging the capacitor in phase mixer 402 before the next rising edge of delayed clock signal CLKD at 412 begins discharging the capacitor.

Phase mixer 404 receives delayed inverted clock signal bCLKD at 416 and clock signal CLK at 410. In operation, the rising edge of delayed inverted clock signal bCLKD at 416 occurs prior to the rising edge of clock signal CLK at 410 to begin discharging the capacitor in phase mixer 404. The rising edge of delayed inverted clock signal bCLKD at 416 occurs closer to the rising edge of clock signal CLK at 410, than does the rising edge in inverted clock signal bCLK at 414 that was delayed to provide the rising edge of delayed inverted clock signal bCLKD at 416. By receiving delayed inverted clock signal bCLKD at 416, instead of inverted clock signal bCLK at 414, at the early input E, phase mixer 404 provides a pulse after a shorter mixing time than duty cycle corrector 28. Also, receiving delayed inverted clock signal bCLKD at 416, instead of inverted clock signal bCLK at 414, at the early input E provides more time for pre-charging the capacitor in phase mixer 404 before the next rising edge of delayed inverted clock signal bCLKD at 416 begins discharging the capacitor.

Figure 7:
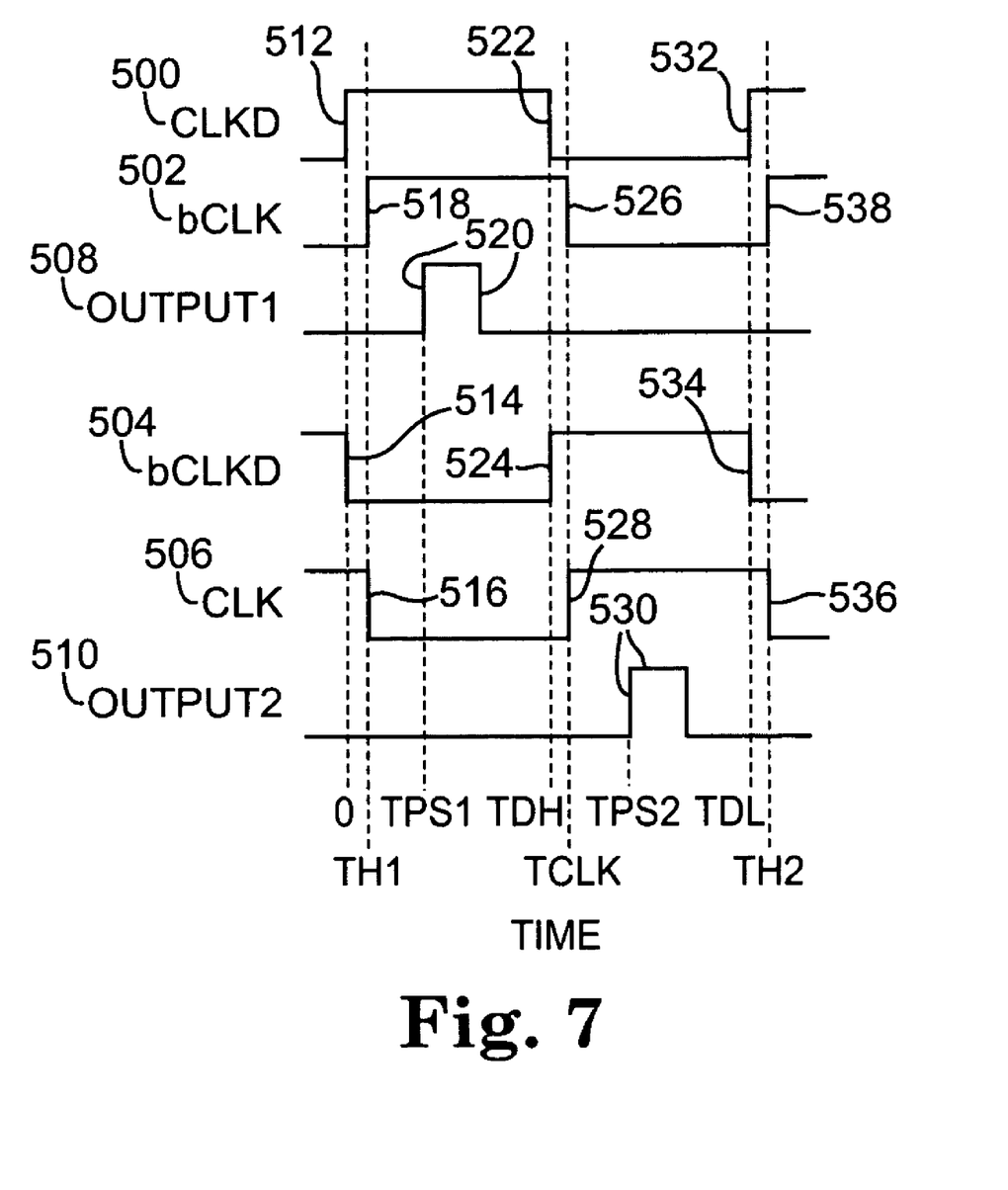
FIG. 7 is a timing diagram illustrating the operation of the other duty cycle corrector.

FIG. 7 is a timing diagram illustrating the operation of duty cycle corrector 400 of FIG. 6. Duty cycle corrector 400 includes phase mixer 402 and phase mixer 404. Phase mixer 402 includes an early input E that receives delayed clock signal CLKD at 500 and a late input L that receives inverted clock signal bCLK at 502. Phase mixer 404 includes an early input E that receives delayed inverted clock signal bCLKD at 504 and a late input L that receives clock signal CLK at 506.

Phase mixer 402 provides output signal OUTPUT1 at 508 and phase mixer 404 provides output signal OUTPUT2 at 510. Each of the output signals, OUTPUT1 at 508 and OUTPUT2 at 510, includes one pulse per clock cycle of clock signal CLK at 506 and inverted clock signal bCLK at 502. Each pulse provided by phase mixer 404 is one half clock cycle from a pulse provided by phase mixer 402 and each pulse provided by phase mixer 402 is one half clock cycle from a pulse provided by phase mixer 404.

At time 0, delayed clock signal CLKD at 500 transitions to a high logic level at 512 and inverted delayed clock signal bCLKD at 504 transitions to a low logic level at 514. The output of the early signal inverter in phase mixer 402 transitions to a low logic level and the output of the first NAND gate in phase mixer 402 transitions to a high logic level, which turns on the early signal NMOS transistor and turns off the first PMOS transistor. This terminates charging of the capacitor and begins the discharging of the capacitor in phase mixer 402 via the early signal NMOS transistor.

At time TH1, clock signal CLK at 506 transitions to a low logic level at 516 and inverted clock signal bCLK at 502 transitions to a high logic level at 518. The output of the first NOR gate transitions to a high logic level that turns on the late signal NMOS transistor and turns off the first PMOS transistor. The capacitor in phase mixer 402 is discharged via the early signal NMOS transistor and the late signal NMOS transistor. At time TPS1, the voltage on the capacitor in phase mixer 402 crosses the threshold voltage of the output inverter and output signal OUTPUT1 at 508 transitions to a high logic level to provide a pulse at 520.

At time TDH, delayed clock signal CLKD at 500 transitions to a low logic level at 522 and inverted delayed clock signal bCLKD at 504 transitions to a high logic level at 524. The output of the early signal inverter in phase mixer 404 transitions to a low logic level and the output of the first NAND gate in phase mixer 404 transitions to a high logic level, which turns on the early signal NMOS transistor and turns off the first PMOS transistor. This terminates charging of the capacitor and begins the discharging of the capacitor in phase mixer 404 via the early signal NMOS transistor.

At time TCLK, inverted clock signal bCLK at 502 transitions to a low logic level at 526 and clock signal CLK at 506 transitions to a high logic level at 528. The output of the first NOR gate in phase mixer 404 transitions to a high logic level that turns on the late signal NMOS transistor and turns off the first PMOS transistor. The capacitor in phase mixer 404 is discharged via the early signal NMOS transistor and the late signal NMOS transistor. At time TPS2, the voltage on the capacitor in phase mixer 404 crosses the threshold voltage of the output inverter and output signal OUTPUT2 at 510 transitions to a high logic level to provide a pulse at 530.

At time TDL, delayed clock signal CLKD at 500 transitions to a high logic level at 532 and inverted delayed clock signal bCLKD at 504 transitions to a low logic level at 534. The output of the early signal inverter in phase mixer 402 transitions to a low logic level and the output of the first NAND gate in phase mixer 402 transitions to a high logic level, which turns on the early signal NMOS transistor and turns off the first PMOS transistor. This terminates charging of the capacitor and begins the discharging of the capacitor in phase mixer 402 via the early signal NMOS transistor.

At time TH2, clock signal CLK at 506 transitions to a low logic level at 536 and inverted clock signal bCLK at 502 transitions to a high logic level at 538. The output of the first NOR gate transitions to a high logic level that turns on the late signal NMOS transistor and turns off the first PMOS transistor. The capacitor in phase mixer 402 is discharged via the early signal NMOS transistor and the late signal NMOS transistor and the pulse sequence repeats in output signals, OUTPUT1 at 508 and OUTPUT2 at 510.

One pulse is provided in output signal OUPUT1 at 508 and one pulse is provided in output signal OUTPUT2 at 510 during each clock cycle of clock signal CLK at 506 and inverted clock signal bCLK at 502. Each pulse in output signal OUTPUT1 at 508 starts one clock cycle after the start of another pulse in output signal OUTPUT1 at 508, and one half clock cycle after the start of a pulse in output signal OUTPUT2 at 510. Each pulse in output signal OUTPUT2 at 510 starts one clock cycle after the start of another pulse in output signal OUTPUT2 at 510, and one half clock cycle after the start of a pulse in output signal OUTPUT1 at 508.

Clock signal CLK at 506 is delayed almost one half clock cycle to provide delayed clock signal CLKD at 500. The rising edge at 512 of delayed clock signal CLKD at 500 occurs less than one half clock cycle before the rising edge at 518 of inverted clock signal bCLK at 502 to begin discharging the capacitor in phase mixer 402. By receiving delayed clock signal CLKD at 500, instead of clock signal CLK at 506, at the early input E, phase mixer 402 provides the pulse at 520 after a shorter mixing time between the rising edge at 512 and the rising edge at 518, as compared to the longer mixing time between the rising edge (not shown) of clock signal CLK at 506 and the rising edge at 518. Also, by receiving delayed clock signal CLKD at 500, instead of clock signal CLK at 506, at the early input E, the time for charging the capacitor in phase mixer 402 is increased to the time between the pulse at 520 and the delayed rising edge at 532 in the delayed clock signal CLKD at 500, as compared to the time between the pulse at 520 and the rising edge at 528 in clock signal CLK at 506.

Inverted clock signal bCLK at 502 is delayed almost one half clock cycle to provide delayed inverted clock signal bCLKD at 504. The rising edge at 524 of delayed inverted clock signal bCLKD at 504 occurs less than one half clock cycle before the rising edge at 528 of clock signal CLK at 506 to begin discharging the capacitor in phase mixer 404. By receiving delayed inverted clock signal bCLKD at 504, instead of inverted clock signal bCLK at 502, at the early input E, phase mixer 404 provides the pulse at 530 after a shorter mixing time between the rising edge at 524 and the rising edge at 528, as compared to the longer mixing time between the rising edge at 518 of inverted clock signal bCLK at 502 and the rising edge at 528. Also, by receiving delayed inverted clock signal bCLKD at 504, instead of inverted clock signal bCLK at 502, at the early input E, the time for charging the capacitor in phase mixer 404 is increased to the time between the pulse at 530 and the next rising edge in the delayed inverted clock signal bCLKD at 504, as compared to the time between the pulse at 530 and the rising edge at 538 in inverted clock signal bCLK at 502.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A duty cycle corrector, comprising:
    a first circuit;
    a second circuit; and
    a third circuit configured to reach a threshold value in response to a charge flow that is regulated by the first circuit and the second circuit;
    wherein the first circuit is configured to receive a clock signal and change the charge flow at a first transition of the clock signal to provide a first charge flow and the second circuit is configured to change the charge flow at a second transition of the clock signal to provide the first charge flow, and the first circuit and the second circuit are configured to change the charge flow to provide a second charge flow opposite to the first charge flow in response to reaching the threshold value.

2. The duty cycle corrector of claim 1, wherein the first circuit is configured to increase the first charge flow at the first transition and the second circuit is configured to increase the first charge flow at the second transition.

3. The duty cycle corrector of claim 1, wherein the first circuit is configured to decrease the first charge flow in response to reaching the threshold value and the second circuit is configured to decrease the first charge flow in response to reaching the threshold value.

4. The duty cycle corrector of claim 1, wherein the third circuit comprises a capacitor and the first charge flow discharges the capacitor, wherein the first circuit is configured to increase the first charge flow away from the capacitor at the first transition and the second circuit is configured to increase the first charge flow away from the capacitor at the second transition.

5. The duty cycle corrector of claim 4, wherein the first circuit is configured to decrease the first charge flow away from the capacitor in response to reaching the threshold value and the second circuit is configured to decrease the first charge flow away from the capacitor in response to reaching the threshold value.

6. The duty cycle corrector of claim 1, wherein the third circuit comprises:
    a capacitor that receives the first charge flow and the second charge flow, wherein the first charge flow charges the capacitor and the second charge flow discharges the capacitor.

7. The duty cycle corrector of claim 6, wherein the first charge flow provided to the capacitor between the first transition and the second transition of the clock signal charges the capacitor at a first rate and the first charge flow provided to the capacitor after the second transition of the clock signal charges the capacitor at a second rate that is higher than the first rate.

* * * * *